(12) United States Patent
Alshahrani

(10) Patent No.: US 10,065,868 B2
(45) Date of Patent: Sep. 4, 2018

(54) COUPLING PHOTOVOLTAIC AND CONCENTRATED SOLAR POWER TECHNOLOGIES FOR DESALINATION

(71) Applicant: Saudi Arabian Oil Company, Dhahran (SA)

(72) Inventor: Yazeed Safar Alshahrani, Al-Khubar (SA)

(73) Assignee: Saudi Arabian Oil Company, Dhahran (SA)

( * ) Notice: Subject to any disclaimer, the term of this patent is extended or adjusted under 35 U.S.C. 154(b) by 190 days.

(21) Appl. No.: 15/083,043

(22) Filed: Mar. 28, 2016

(65) Prior Publication Data

US 2017/0275182 A1     Sep. 28, 2017

(51) Int. Cl.
*C02F 1/14* (2006.01)
*C02F 1/06* (2006.01)
(Continued)

(52) U.S. Cl.
CPC ............. *C02F 1/14* (2013.01); *B01D 1/0035* (2013.01); *B01D 1/28* (2013.01); *B01D 3/065* (2013.01);
(Continued)

(58) Field of Classification Search
CPC .... C02F 1/041; C02F 1/06; C02F 1/14; C02F 1/441; F24J 2/06; B01D 1/0035;
(Continued)

(56) References Cited

U.S. PATENT DOCUMENTS 4,083,781 A * 4/1978 Conger ................ B01D 61/022
210/651
6,391,162 B1   5/2002 Kamiya et al.
(Continued)

FOREIGN PATENT DOCUMENTS

EP           2384799 A1   11/2011
KR      20110015305 A     2/2011
(Continued)

OTHER PUBLICATIONS

Y. Alshahrani, "Solar Generated Power," Dissertation, the University of Warwick, Aug. 2014.
(Continued)

*Primary Examiner* — Brian A McCaig
(74) *Attorney, Agent, or Firm* — Bracewell LLP; Constance G. Rhebergen; Kevin R. Tamm

(57) ABSTRACT

Systems and methods for the desalination of water are disclosed. A system includes a concentrated solar power (CSP) system, the CSP system operable to concentrate solar energy to increase temperature and pressure of a heat transfer fluid and operable to produce steam utilizing heat from the heat transfer fluid; a photovoltaic (PV) system, the PV system operable to collect solar energy to produce electricity; a desalination system in fluid communication with the CSP system and in electrical communication with the PV system, the desalination system operable to produce desalinated water from a salt water source utilizing the steam from the CSP system and electricity from the PV system; and a pump station in fluid communication with the CSP system and the desalination system, and in electrical communication with the PV system, the pump station operable to transmit the desalinated water to consumers for use.

9 Claims, 2 Drawing Sheets

(51) Int. Cl.

| | |
|---|---|
| *B01D 1/28* | (2006.01) |
| *B01D 61/10* | (2006.01) |
| *F24J 2/06* | (2006.01) |
| *C02F 1/44* | (2006.01) |
| *B01D 61/02* | (2006.01) |
| *C02F 1/04* | (2006.01) |
| *B01D 3/06* | (2006.01) |
| *B01D 3/14* | (2006.01) |
| *B01D 1/00* | (2006.01) |
| *C02F 103/08* | (2006.01) |
| *F03G 6/06* | (2006.01) |
| *F22B 1/00* | (2006.01) |
| *H01L 31/04* | (2014.01) |

(52) U.S. Cl.
CPC ........... *B01D 3/146* (2013.01); *B01D 61/025* (2013.01); *B01D 61/10* (2013.01); *C02F 1/041* (2013.01); *C02F 1/06* (2013.01); *C02F 1/441* (2013.01); *F24J 2/06* (2013.01); *B01D 2313/365* (2013.01); *C02F 2103/08* (2013.01); *C02F 2201/009* (2013.01); *C02F 2303/10* (2013.01); *F03G 6/06* (2013.01); *F03G 6/067* (2013.01); *F22B 1/006* (2013.01); *H01L 31/04* (2013.01)

(58) Field of Classification Search
CPC ........ B01D 1/28; B01D 3/0065; B01D 3/146; B01D 61/025; B01D 61/10
See application file for complete search history.

(56) References Cited

U.S. PATENT DOCUMENTS

| | | | |
|---|---|---|---|
| 2004/0118671 A1 | 6/2004 | Burgos | |
| 2007/0181473 A1* | 8/2007 | Manth | B01D 61/022 210/137 |
| 2008/0156731 A1* | 7/2008 | Gordon | B01D 61/025 210/652 |
| 2010/0314238 A1 | 12/2010 | Frolov et al. | |
| 2010/0319684 A1 | 12/2010 | Almogy et al. | |
| 2012/0067338 A1 | 3/2012 | Funcheon | |
| 2012/0085094 A1 | 4/2012 | Davis et al. | |
| 2014/0034479 A1* | 2/2014 | Peng | C01B 3/384 203/22 |
| 2014/0290247 A1 | 10/2014 | Mishima et al. | |
| 2015/0175443 A1 | 6/2015 | Godshall | |
| 2016/0017759 A1 | 1/2016 | Gayawal et al. | |

FOREIGN PATENT DOCUMENTS

| | | |
|---|---|---|
| WO | 2009144700 A1 | 12/2009 |
| WO | 2012072331 A2 | 6/2012 |
| WO | 2016008007 A1 | 1/2016 |

OTHER PUBLICATIONS

International Search Report and Written Opinion dated May 29, 2017 for related pct application PCT/US2017/024497.

* cited by examiner

COUPLING PHOTOVOLTAIC AND CONCENTRATED SOLAR POWER TECHNOLOGIES FOR DESALINATION

BACKGROUND

Field

Embodiments of the disclosure relate to systems of and methods for using combined photovoltaic (PV) and concentrated solar power (CSP) technologies. In particular, embodiments relate to using combined PV and CSP technologies for autonomous water treatment, including desalination, and autonomous water transport to remote areas.

Description of the Related Art

Solar power plant technologies can be divided into two main groups: PV power plants, which use photovoltaic modules to convert solar irradiation directly into electricity, and solar thermal power plants, which generate electricity indirectly, via intermediate conversion into heat and mechanical energy. Solar power plants can also be divided into concentrating and non-concentrating systems. Concentrating solar thermal power plants, also known as concentrated solar power (CSP), produce electric power by first converting the sun's energy into high temperature heat using various mirror configurations. Then, the heat is used to produce high temperature steam, which is converted into electricity using conventional generators.

The primary resource for CSP systems is the direct solar irradiance perpendicular to a surface that continuously tracks the sun (direct normal irradiation, or DNI). Therefore, CSP systems have their highest potential in the "sun belt" of the earth, which is between the 20th and 40th degree of latitude south and north. There are four main CSP types based on the sun ray concentrating principle, and these include parabolic trough, Fresnel trough, tower central receiver, and tower distributed receiver. In contrast, non-concentrating systems, like the solar chimney and "normal" PV systems, use global irradiation (direct fraction of the sunlight as well as the diffuse fraction).

Desalination is the process of separating pure water from a solution of water and ions, for example when the dissolved salts in salt water, such as sea water, are removed. There are many technologies which are used in water desalination, such as, multi-stage flashing (MSF), reverse osmosis (RO), multiple effect distillation (MED), vapor compression (VC), and others. The most common technology used in the world for desalination is RO, while MSF and MED are the most common in many of the Gulf States, such as Saudi Arabia.

MSF and MED technologies can be used for large-scale water production in comparison to RO. The daily production of an MSF plant can achieve about one million cubic meters of desalinated water per day. RO technology has the capacity of producing up to about 150,000 cubic meters of desalinated water in one day. Power generation and water desalination plants usually depend on burning fossil fuel resources, such as, natural gas, oil, and coal. In developing countries, fossil fuel plants provide most of the electricity and clean water. These plants implement rotating machinery in order to convert the thermal energy obtained from the combustion of hydrocarbons to mechanical energy, and then convert the energy again into electrical energy using a generator.

The combustion process takes place in a boiler which heats up and vaporizes water in the boiler's pipes to produce steam with high temperature and pressure. The boiler is set to produce super-heated steam to spin a turbine to convert thermal energy into mechanical energy, and a shaft of the turbine rotates at either about 3000 or 3600 revolutions per minute (RPM), depending on the operating frequency of either 50 Hertz (Hz) or 60 Hz. The turbine is coupled with a generator to convert the rotation of the shaft into electricity by having an electro-magnetic field (EMF) in the generator which surrounds the shaft. The boiler burns one or more fuels whether it is crude oil, natural gas, coal, or a mixture thereof to operate the combustion process and to generate high pressure steam.

Thermal plants are steam driven power plants which are constructed based on the Rankine cycle configuration. The cycle is to heat and turn the water into steam using a boiler which spins the steam turbine and then it drives the electric generator to generate electricity. Following a steam turbine, the fluid stream will proceed through a condenser to be condensed and recycled again to the boiler using boiler feed pumps. There is great variation in thermal power plant design due to the differences in fossil fuel sources and specifications.

MSF is a major desalination technology implemented in certain Middle Eastern countries, such as Saudi Arabia. MSF is used for large-scale desalinated water production and has the characteristic of better water quality and benefits from flexibility in the number of stages, for example from about 16 up to about 34 stages. RO is a desalination technology which is used to purify water using a semi permeable membrane. RO is based on the osmosis phenomena; that is the movement of solvent naturally from a low solute concentration into a high solute concentration through a membrane until both sides are balanced. RO can be accomplished by applying pressure to seawater to arrive at pure water after the sea water proceeds through a semi-permeable membrane.

MSF is a technology used for large-scale production, and it requires sea water to fulfil its requirement for water. MSF consumes a large amount of thermal and electrical power for pumping. The materials selection is quite critical to avoid corrosion and its consequences. Overall plant efficiency is about 25%, as MSF requires a large amount of steam, and hence there is no low pressure (LP) turbine. Currently, certain water desalination plants are coupled with oil-fired power plants. Conventional plants feed the water desalination units either with steam in the case of MSF or electricity in the case of RO units. The water desalination process usually depends on the existence of a thermal power block where the steam fed to the MSF chambers has already been used and passed through high pressure and intermediate pressure turbines. This steam fed to the MSF is used to vaporize the seawater inside the chambers in order to obtain the desalinated water from the other side.

In RO technology, some of the electricity produced in a thermal power block goes to an RO plant to feed and operate the high pressure pumps and associated systems in the RO process. Prior art systems and methods lack independence from electrical grid connections. For example, some systems and methods require a grid connection to supply MSF and MED desalination plants with electricity, while other integrative systems require grid connections to dispatch generated power. Even when prior art methods and systems are combined, such combinations still requires a grid connection to either transfer power to the grid or utilize power from the grid.

SUMMARY

The present technology includes the concept of using both PV and CSP solar systems in rural areas to create electricity and steam, respectively, for use in desalination technologies such as MSF and MED technologies. By combining CSP and PV technologies, large-scale seawater desalination can be achieved with "stand-alone" or autonomous systems and methods, or in other words without, or in the absence of, a connection to an electrical grid. Prior art PV, CSP, and desalination technologies require an electrical grid connection. The unique systems and methods disclosed herein have the advantage of being stand-alone, or in other words supplying desalination equipment, such as for example MSF and MED systems, with steam from CSP and electricity from PV power, and no grid connection is required, in some embodiments.

Stand-alone systems are ideal for rural areas in which there is no grid connection available to supply a desalination unit with electricity, as well as in the case of poor infrastructure. This unique approach enables the development of rural areas, as well as helps support rapid increase in water consumption across the world especially in dry countries, for instance, Saudi Arabia. Moreover, since rural areas and dry cities away from coasts struggle to fulfil their dramatic increase in water consumption, embodiments disclosed herein propose pumping desalinated water to consumers through a pump station which is powered by solar energy. A pump station is proposed, which depends on the CSP (for steam) and PV power (for electricity) to operate its pumps. In some embodiments, the pump stations of the present disclosure require no connection to an electrical grid and operate in the absence of a connection to an electrical grid.

One advantage of this improvement is that an electrical grid connection is no longer required (stand-alone configuration) in both the desalination process and the operation of large pumps in order to send desalinated water to consumers. Solar pump stations of the present disclosure are proposed to utilize steam from a CSP system to drive turbine driven pumps and can additionally or alternatively utilize electricity from PV systems to operate motor driven pumps, to transport desalinated water product to rural villages located far from the coast with poor infrastructure.

As noted previously, in desalination technologies a variety of systems can be used to remove salt from water in order to produce desalinated, and ultimately potable, water. For example, salt water from the ocean can be made into potable water. These technologies include multi-stage flash (MSF), multiple effect distillation (MED), and reverse osmosis (RO) systems. However, desalination technologies are energy intensive, requiring a large amount of electricity. As embodiments of the present disclosure use a stand-alone system with a combination of CSP and PV systems and methods for supplying electricity, certain embodiments will be ideal for off-grid systems where there is no electric network available nearby.

One advantage of using PV and CSP systems to provide electricity and steam to desalination technologies is that no input from an electricity grid is required, and no input from fossil fuels is required. In other words, only solar energy is required for the PV, CSP, and desalination systems to create a desalinated water product for consumers.

MSF and MED technologies rely largely on steam to heat and vaporize seawater in process chambers, and CSP technology has the advantage of producing steam which can supply MSF and MED processes. CSP solar fields can capture heat to produce heat transfer fluids at high temperatures and high pressures which can produce steam to spin turbines. Therefore in certain embodiments disclosed here, CSP technology is used to supply steam and PV technology is used to supply electricity to MSF in addition to or alternative to MED units to desalinate water for human use, and the CSP and PV technologies are also used to operate a pump station with pumps in order to transport desalinated water to customers away from a coast or source of salt water.

MSF desalination technology has the advantage of large-scale production based on the thermal process it relies on, and CSP has the capability to produce steam through the heat captured from the solar radiation by utilizing a heat transfer fluid (HTF). After a HTF has captured the heat from a CSP system concentrating solar rays, the HTF flows from the solar field to a heat exchanger, also referred to as a steam generator or boiler, to produce steam. Then, steam is directed to MSF chambers filled with salt water to heat and vaporize the salt water and obtain desalinated water at another side. In certain embodiments, CSP can be used to generate steam for an MSF process while PV technology is used to supply electricity to intake and circulating pumps, and to operate auxiliary systems. Configurations of the present disclosure have the benefit of lower cost, as the power block has been removed from the plant configuration.

Additionally, systems and methods of the present disclosure provide the ability to eliminate the need for thermal energy storage (TES), which is used in CSP power plants to operate at night when the sun is not present. In the present technology, product water (desalinated water) can be easily stored in tanks for night use for consumers while the plant is shut down. Such an ability to store product water adds flexibility to the plant and makes the cycle and process very simple and avoids the concern of operating at night. In other words, no power or solar power is necessary at night or in the dark to operate the systems and methods of the present disclosure when a sufficient amount of desalinated water is stored during times of solar exposure.

Therefore, disclosed herein is a system for desalination of salt water. The system includes a concentrated solar power (CSP) system, the CSP system operable to concentrate solar energy to increase temperature and pressure of a heat transfer fluid and operable to produce steam utilizing heat from the heat transfer fluid and a photovoltaic (PV) system, the PV system operable to collect solar energy to produce electricity. The system further includes a desalination system in fluid communication with the CSP system and in electrical communication with the PV system, the desalination system operable to produce desalinated water from a salt water source utilizing the steam from the CSP system and electricity from the PV system; and a pump station in fluid communication with the CSP system and the desalination system, and in electrical communication with the PV system, the pump station operable to transmit the desalinated water to consumers for use.

In some embodiments, the CSP system includes CSP technology selected from the group consisting of: a parabolic trough, a Fresnel trough, a tower central receiver, a tower distributed receiver, and combinations thereof. In other embodiments, the system is a stand-alone system without any connection to an external electrical grid. Still in other embodiments, the desalination system includes desalination technology selected from the group consisting of: multi-stage flashing (MSF), reverse osmosis (RO), multiple effect distillation (MED), vapor compression (VC), and combinations thereof. In yet other embodiments, the desalination system includes MSF and MED technology.

In some embodiments, the pump station includes turbine driven pumps and motor driven pumps. Still in other embodiments, a portion of the steam from the CSP system drives the turbine driven pumps and a portion of the electricity from the PV system drives the motor driven pumps, to transmit the desalinated water to consumers for use. In some embodiments of the system, the desalinated water is potable water.

In certain embodiments, the desalination system is operable to flash sea water stored in multiple stages. Still in other embodiments, the system further comprises tanks for storage of a portion of the desalinated water, the tanks operable to store a sufficient amount of desalinated water to transmit to consumers for use while the desalination system is inoperable during periods of substantially no solar activity.

Additionally disclosed is a method for desalination of salt water. The method includes the steps of concentrating solar power to increase temperature and pressure of a heat transfer fluid and to produce steam utilizing heat from the heat transfer fluid; applying photovoltaic (PV) cells to collect solar energy to produce electricity; desalinating salt water using the steam and the electricity to produce desalinated water; communicating a portion of the steam and a portion of the electricity to a pump station; and pumping the desalinated water with the pump station to consumers for use. In some embodiments of the method, the step of concentrating solar power comprises applying concentrated solar power (CSP) technology selected from the group consisting of: a parabolic trough, a Fresnel trough, a tower central receiver, a tower distributed receiver, and combinations thereof.

Still in other embodiments of the method, the method is carried out in a stand-alone system without any connection to an external electrical grid. In certain embodiments, the step of desalinating salt water includes applying desalination technology selected from the group consisting of: multi-stage flashing (MSF), reverse osmosis (RO), multiple effect distillation (MED), vapor compression (VC), and combinations thereof. Still in other embodiments, the method includes applying MSF and MED technology. In certain embodiments of the method, the pump station includes turbine driven pumps and motor driven pumps.

In some embodiments, a portion of the steam drives the turbine driven pumps and a portion of the electricity drives the motor driven pumps, to transmit the desalinated water to consumers for use. Still in other embodiments of the method, the desalinated water is potable water. In yet other embodiments, the step of desalinating salt water comprises flashing sea water stored in multiple stages. Still in other embodiments, the method further comprises the step of storing a portion of the desalinated water, the portion of desalinated water comprising a sufficient amount of desalinated water to transmit to consumers for use during periods of substantially no solar activity.

BRIEF DESCRIPTION OF THE DRAWINGS

These and other features, aspects, and advantages of the present disclosure will become better understood with regard to the following descriptions, claims, and accompanying drawings. It is to be noted, however, that the drawings illustrate only several embodiments of the disclosure and are therefore not to be considered limiting of the disclosure's scope as it can admit to other equally effective embodiments.

DETAILED DESCRIPTION

So that the manner in which the features and advantages of the embodiments of systems and methods for using combined PV and CSP technology for salt water desalination and transport, as well as others, which will become apparent, may be understood in more detail, a more particular description of the embodiments of the present disclosure briefly summarized previously may be had by reference to the embodiments thereof, which are illustrated in the appended drawings, which form a part of this specification. It is to be noted, however, that the drawings illustrate only various embodiments of the disclosure and are therefore not to be considered limiting of the present disclosure's scope, as it may include other effective embodiments as well.

Figure 1:
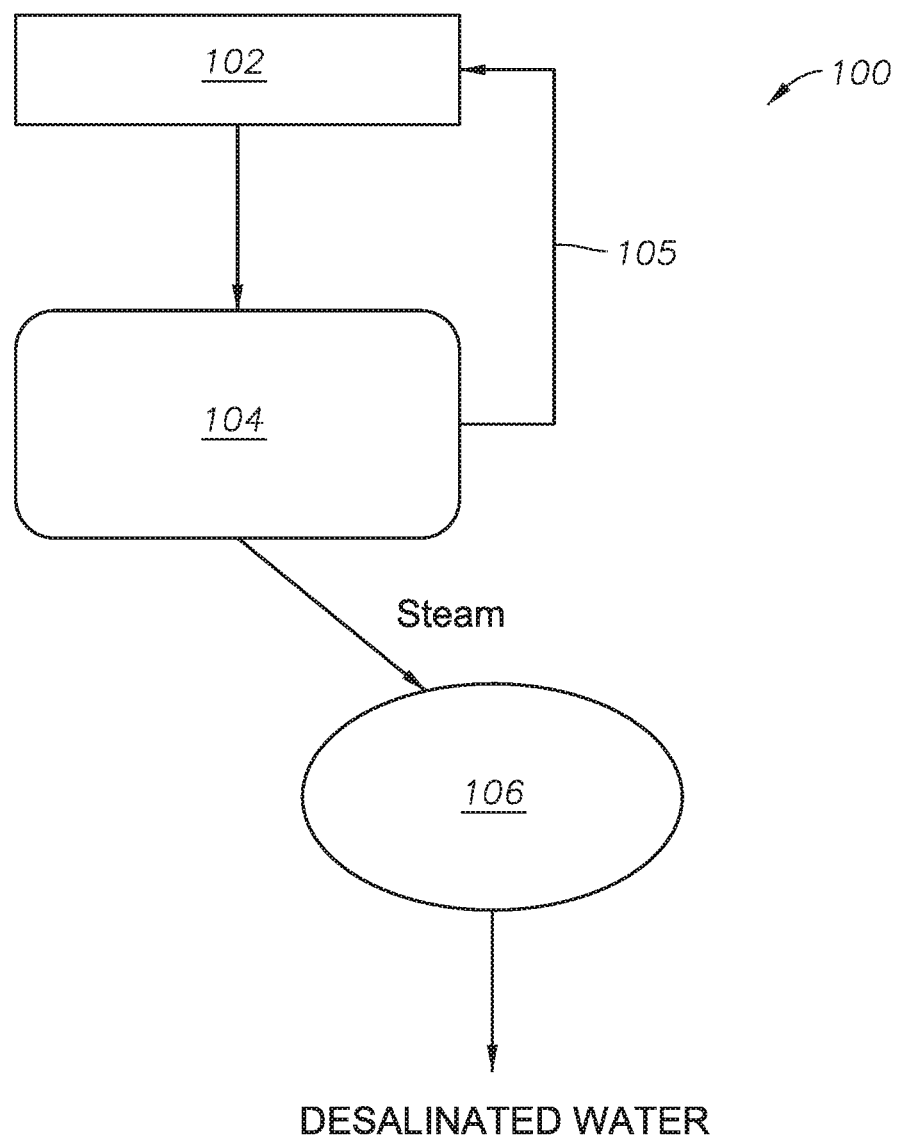
FIG. 1 is a process schematic for producing desalinated water in one embodiment of the present disclosure.

Referring now to FIG. 1, a process schematic is shown for producing desalinated water in one embodiment of the present disclosure. In combined CSP desalination system 100, a solar trough field 102 concentrates solar energy into a heat transfer fluid. There are four main CSP types based on the sun ray concentrating principle, and these include parabolic trough, Fresnel trough, tower central receiver, and tower distributed receiver. Any suitable type and combination of CSP trough field can be used in the embodiment of FIG. 1 as long as enough solar energy is collected to product the requisite amount of steam, described as follows. Solar energy is concentrated to heat a heat transfer fluid.

One example heat transfer fluid suitable for low pressure steam generation through solar trough collectors is thermal oil, and another is direct molten salt (DMS). In some embodiments, low pressure steam has an outlet temperature and pressure at about 120° C. and 2 bar, respectively, while medium pressure steam is about 230° C. and 18 bar.

For an example CSP field arrangement, there are two streams of steam. One low pressure steam stream is for desalination, and one medium pressure steam stream is used to create vacuum. Each stream consists of solar collectors in loops, and a low pressure steam stream can utilize a majority of the CSP field exceeding 100 loops when considering large-scale seawater desalination. An example CSP field has large area, considering the solar field size can be larger than about 700,000 m$^2$. The energy yield and nominal thermal output from the CSP side can be greater than about 240 MWt (thermal megawatts). The PV field can supply more than 15 MW direct electricity for all auxiliary power consumption in the desalination plant necessary to sustain its large-scale production.

The heat transfer fluid is transported to a boiler 104 (also referred to as a steam generator) in which water is heated by the heat transfer fluid to produce steam. The heat transfer fluid, once the heat has been transferred to the water to produce steam in the boiler 104, is returned to solar trough field 102 by recycle line 105 to collect more heat/solar energy from the sun's rays. Steam produced in the boiler 104 is transferred to MSF chamber 106 to carry out multi-stage flashing. One or more steam streams at low pressure, medium pressure, or high pressure can be supplied from boiler 104 to MSF chamber 106, depending on the steam requirements of MSF chamber 106. Desalinated water is produced from multi-stage flashing.

As MSF and MED processes depend largely on steam to heat and vaporize salt water in desalination chambers, CSP technology has the advantage of producing steam which can supply steam to MSF and MED processes. Solar trough field 102 is operable to increase the temperature of the heat transfer fluid to reach a high temperature and a relatively high pressure by reflecting and focusing the sunlight onto one or more tubes which contain the heat transfer fluid.

For large-scale thermal desalination with MSF and MED, an incremental vacuum in the chambers is needed, as the temperature generally drops in the middle and latest chambers of the system. A vacuum enables these systems to eliminate a high boiling point and forces flashing to take place, which reduces the risk of corrosion in the system (the risk of corrosion brought about because sea water has a high total dissolved solids (TDS) count at greater than about 40,000 ppm). Implementing CSP provides the capability to generate superheated steam which is operable to drive large MSF and MED units to supply large, rural communities with fresh water. In other words, a vacuum across the desalination chambers must be created through ejectors that are supplied with medium pressure steam from the CSP field. The CSP systems disclosed here are operable to supply sufficient steam to one or more desalination units to build sufficient vacuum and operate independently of an electrical grid connection.

Certain assumptions for steam temperatures, pressures, and flow rates to be used for MSF/MED vary significantly and depend on the plant capacity and location parameters (for example Direct Normal Irradiance rate). In one embodiment, low pressure steam is supplied at 120° C. and 2 bar at 330 ton/hr. In one embodiment, medium pressure steam is supplied at 230° C. and 18 bar at 10 ton/hr.

Figure 2:
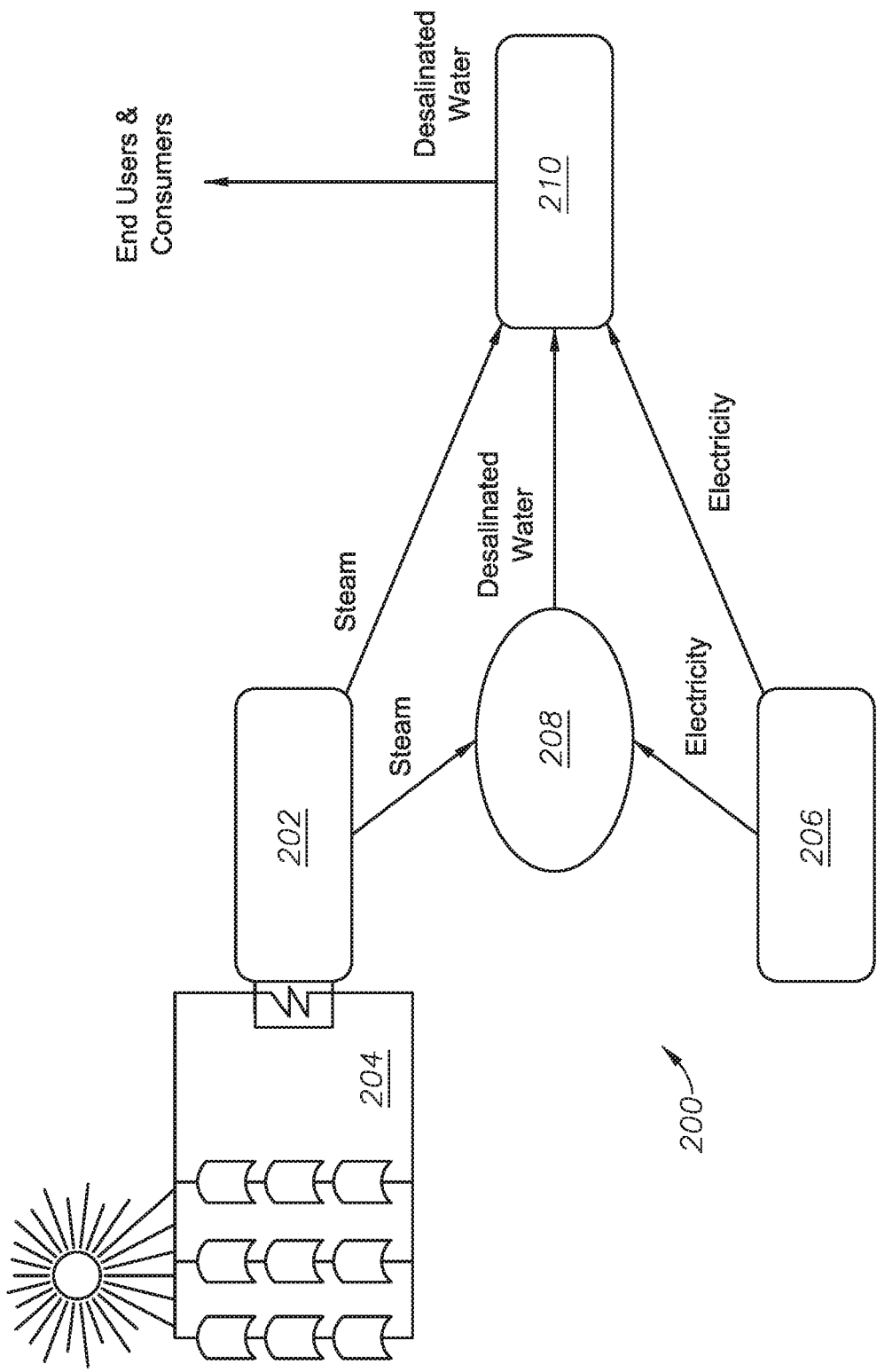
FIG. 2 is a process schematic for producing and transporting desalinated water in one embodiment of the present disclosure.

Referring now to FIG. 2, a process schematic is provided for producing and transporting desalinated water in one embodiment of the present disclosure. FIG. 2 provides one embodiment of using CSP and PV technology in seawater desalination without involvement of a power generation block or connection to an electrical power grid. CSP has not been used for the sole purpose of water desalination before, as countries with high implementation of CSP technology generally do not lack water resources and availability. In combined CSP and PV desalination system 200, CSP system 202 uses solar trough field 204 to collect solar energy. The solar energy is concentrated into a heat transfer fluid to increase temperature and pressure of the heat transfer fluid. The heat transfer fluid is used to heat water and produce steam in CSP system 202.

A PV system 206 collects solar energy to produce electricity. Desalination unit 208 receives steam, optionally including superheated steam, high pressure steam, medium pressure steam, or low pressure steam, from CSP system 202 and electricity from PV system 206. Desalination unit 208 can include any one of or any combination of desalination units such as MSF, MED, and RO. Desalinated water, steam, and electricity are communicated to a pump station 210. Pump station 210 can fluidly convey desalinated water to end users and consumers. FIG. 2 shows one embodiment for implementing CSP and PV technology for a large-scale water desalination plant to cope with a large increase in demand for clean water. Many countries suffer from lack of water resources and un-environmentally friendly installation of water desalination facilities using fossil fuel-fired MSF plants.

Since rural areas and dry cities away from coasts struggle to fulfil their dramatic increase in water consumption, embodiments herein pump desalinated water to consumers through a pump station which is powered by solar energy. Pump station 210 depends on CSP system 202 for steam and PV system 206 for electricity in order to operate its pumps. One advantage is that no electrical grid connection is required for a stand-alone configuration in either of the desalination process or the operating pumps in order to send desalinated water to consumers. Pump station 210 can utilize steam from CSP system 202 to drive turbine driven pumps in addition to or alternative to using electricity from PV system 206 to operate motor driven pumps to send desalinated water to rural villages located very far from the coast, or other supply of salt water, with poor infrastructure.

In one embodiment, the size of a CSP solar trough field can exceed about 700,000 m² when considering a MSF/MED plant with a capacity of about 70,000 m³/day of desalinated water. The thermal energy output from the solar field is approximately 230 MWt, with a steam flow rate output of about 330 ton/hr of low pressure steam and about 10 ton/hr of medium pressure steam. The temperature and pressures of the streams are about 120° C. and 2 bar for the low pressure steam and 230° C. and 18 bar for medium pressure steam. As the amount of desalinated water produced and transported is a large quantity, in one embodiment about 70,000 m³/day, in order to determine the necessary steam flow and electricity for the pump station, one would need to consider the geographical situation (for example altitude, remoteness, mountain areas) and specific distance between the sending and receiving sides. However, as a generalization, systems and methods of the present disclosure require tons of medium pressure steam from the CSP to drive the turbine-driven pumps and a couple of megawatts of electricity from the PV system to drive motor-driven pumps.

In some MSF water plants, desalination of salt water is achieved in a once-through configuration. In some embodiments herein, salt water is distilled to fresh water by flashing sea water stored in multiple stages. Such a process depends on increasing the water temperature and decreasing the pressure by building vacuum in the stages to maintain flashing of the sea water and hence collect distillate from a condensate collector. As temperature decreases, the vacuum increases in the stages corresponding to the boiling points of sea water in order to keep the sea water flashing. One source of heat in MSF is from steam passed through a heat exchanger, also known as a brine heater, which increases the temperature of the sea water pumped from the sea into the stages. In some embodiments, product water is stored in nearby tanks before pumping to customers, and blow down pumps pump any salt water back to the sea. One of ordinary skill in the art will understand other configurations will be suitable, and other process equipment such as pumps, blowers, condensers, valves, expanders, temperature and pressure meters, etc. can be required for the systems and methods of the present disclosure.

The singular forms "a," "an," and "the" include plural referents, unless the context clearly dictates otherwise.

In the drawings and specification, there have been disclosed embodiments of systems of and methods for using combined PV and CSP technology for salt water desalination and transport, and although specific terms are employed, the terms are used in a descriptive sense only and not for purposes of limitation. The embodiments of the present disclosure have been described in considerable detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

That claimed is:

1. A land-based desalination system for desalination of salt water, the desalination system comprising:
   a concentrated solar power (CSP) system, where the CSP system includes a solar trough field, where the CSP system concentrates solar energy to increase temperature and pressure of a heat transfer fluid and produces steam from a steam water supply utilizing heat from the heat transfer fluid, where an area of the solar trough field exceeds about 700,000 sq. meters, where thermal energy output from the solar trough field exceeds about 240 thermal megawatts, and where the CSP system utilizes CSP technology selected from the group consisting of: a parabolic trough, a Fresnel trough, a tower central receiver, a tower distributed receiver, and combinations thereof to produce steam;

a photovoltaic (PV) system, where the PV system includes PV cells and produces electricity in excess of about 15 megawatts by directly converting solar irradiation to electricity;

a desalination unit in fluid communication with the CSP system and in electrical communication with the PV system, where the desalination unit produces desalinated water from a salt water supply utilizing a portion of the total steam produced by the CSP system and electricity from the PV system, and where the desalination unit utilizes desalination technology selected from the group consisting of: multi-stage flashing (MSF), multiple effect distillation (MED), and combinations thereof; and a pump station in fluid communication with the CSP system and the desalination unit, and in electrical communication with the PV system, where the pump station receives the desalinated water from the desalination unit, where the pump station includes a turbine driven pump and a motor driven pump and transmits the desalinated water to consumers by driving the turbine driven pump utilizing a remaining portion of the total steam produced by the CSP system, the remaining portion of the steam sufficient to drive the turbine driven pump, and driving the motor driven pump utilizing electricity from the PV system, where the desalination system is a stand-alone system and operates to produce desalinated water independent of an external electrical grid.

2. The desalination system according to claim 1, where the desalination system further comprises tanks for storage of a portion of the desalinated water, the tanks operable to store a sufficient amount of desalinated water to transmit to consumers while the desalination system is inoperable during periods of substantially no solar activity.

3. A method for desalination of salt water, the method comprising the steps of:

concentrating solar power on a solar trough field exceeding about 700,000 sq. meters to increase temperature and pressure of a heat transfer fluid and to produce steam from a steam water supply utilizing heat from the heat transfer fluid, where thermal energy output from the solar trough field exceeds about 240 thermal megawatts;

converting, directly, solar irradiation utilizing photovoltaic (PV) cells to produce electricity in excess of about 15 megawatts;

desalinating salt water using a portion of the steam obtained from the steam produced in the concentrating step and the electricity to produce desalinated water from a salt water supply by applying desalination technology selected from the group consisting of: multi-stage flashing (MSF), multiple effect distillation (MED), and combinations thereof;

communicating a remaining portion of the steam obtained from the steam produced in the concentrating step, and a separate portion of the electricity obtained from the electricity produced in the converting step, to a pump station, where the pump station receives the desalinated water and includes a turbine driven pump and a motor driven pump, where the remaining portion of the steam is sufficient to drive the turbine driven pump and the separate portion of the electricity drives the motor driven pump; and pumping the desalinated water with the pump station to consumers, where the method is carried out in a stand-alone system and operates to produce desalinated water independent of an external electrical grid.

4. The method according to claim 3, where the step of concentrating solar power comprises applying concentrated solar power (CSP) technology selected from the group consisting of: a parabolic trough, a Fresnel trough, a tower central receiver, a tower distributed receiver, and combinations thereof.

5. The method according to claim 3, where the desalinated water is potable water.

6. The method according to claim 3, where the step of desalinating salt water comprises flashing sea water stored in multiple stages.

7. The method according to claim 3, the method further comprising the step of storing a portion of the desalinated water, the portion of desalinated water comprising a sufficient amount of desalinated water to transmit to consumers during periods of substantially no solar activity.

8. The method according to claim 3, the method further comprising the step of splitting the portion of the steam into a low pressure steam stream and a medium pressure steam stream, where the low pressure steam stream is introduced in the desalinating step for thermal desalination, where a portion of the total medium pressure steam stream is introduced in the desalinating step to build sufficient vacuum used in the desalination technology, and where a remaining portion of the total medium pressure steam stream is introduced in the communicating step to drive the turbine driven pump.

9. The method according to claim 8, where the low pressure steam stream has temperature at about 120° C., pressure at about 2 bar, and steam flow rate of 330 tons per hour, and the medium pressure steam stream has temperature at about 230° C., pressure at about 18 bar, and steam flow rate of 10 tons per hour.

* * * * *